US009515668B2

(12) United States Patent
Faisal et al.

(10) Patent No.: US 9,515,668 B2
(45) Date of Patent: Dec. 6, 2016

(54) AUTOMATICALLY PLACED-AND-ROUTED ADPLL WITH PWM-BASED DCO RESOLUTION ENHANCEMENT

(71) Applicant: The Regents of The University of Michigan, Ann Arbor, MI (US)

(72) Inventors: Muhammad Faisal, Ann Arbor, MI (US); David D. Wentzloff, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/894,483

(22) PCT Filed: May 31, 2014

(86) PCT No.: PCT/US2014/040426
§ 371 (c)(1),
(2) Date: Nov. 27, 2015

(87) PCT Pub. No.: WO2014/194308
PCT Pub. Date: Dec. 4, 2014

(65) Prior Publication Data
US 2016/0118990 A1   Apr. 28, 2016

Related U.S. Application Data

(60) Provisional application No. 61/830,045, filed on May 31, 2013.

(51) Int. Cl.
*H03L 7/06* (2006.01)
*H03L 7/099* (2006.01)
*H03K 5/134* (2014.01)
*H03L 7/091* (2006.01)
*H03L 7/10* (2006.01)
*H03K 5/00* (2006.01)

(52) U.S. Cl.
CPC ............ *H03L 7/0997* (2013.01); *H03K 5/134* (2014.07); *H03L 7/091* (2013.01); *H03L 7/0995* (2013.01);
(Continued)

(58) Field of Classification Search
USPC ................................. 327/147–149, 156–158
See application file for complete search history.

(56) References Cited

U.S. PATENT DOCUMENTS 7,812,655 B2 * 10/2010 Heinimaki ............ H03L 7/0812
327/158
2002/0084856 A1   7/2002 Von Dolteren, Jr.
(Continued)

FOREIGN PATENT DOCUMENTS

KR   20110070719 A   6/2011

OTHER PUBLICATIONS

International Search Report for application No. PCT/US2014/040426, dated Sep. 23, 2014, 3 pages.

*Primary Examiner* — Adam Houston
(74) *Attorney, Agent, or Firm* — Reising Ethington P.C.

(57) ABSTRACT

An all digital phase-locked loop (PLL) and a method of controlling the PLL is provided. The method includes the steps of receiving a reference signal ($f_{REF}$) at a controller and a time-to-digital converter (TDC), the controller and TDC being coupled to multiple tunable delay elements; receiving at the multiple tunable delay elements a first signal input via the controller and a pulse-width modulation (PWM) circuit; providing an PLL output ($f_{DCO}$) to the TDC at least partially based on the first signal input; and generating a phase error output ($\Phi_{ERR}$) based on the reference signal ($f_{REF}$) and the PLL output ($f_{DCO}$), wherein the phase error output ($\Phi_{ERR}$) is provided as feedback to the controller to control the PLL output ($f_{DCO}$).

14 Claims, 8 Drawing Sheets

(52) U.S. Cl.
CPC ..... H03L 7/103 (2013.01); *H03K 2005/00241* (2013.01); *H03L 2207/06* (2013.01); *H03L 2207/50* (2013.01)

(56) References Cited

U.S. PATENT DOCUMENTS

| | | |
|---|---|---|
| 2008/0012647 A1 | 1/2008 | Risbo et al. |
| 2012/0007643 A1* | 1/2012 | Jian ...................... H03L 7/1976 327/157 |
| 2012/0032718 A1* | 2/2012 | Chan ....................... H03L 7/093 327/156 |
| 2012/0249195 A1 | 10/2012 | Guo et al. |
| 2015/0022277 A1* | 1/2015 | Yamauchi .......... G01C 19/5726 332/109 |
| 2016/0099720 A1* | 4/2016 | Bashir ................. H03B 5/1212 331/8 |
| 2016/0118990 A1* | 4/2016 | Faisal .................... H03K 5/134 327/156 |

* cited by examiner

AUTOMATICALLY PLACED-AND-ROUTED ADPLL WITH PWM-BASED DCO RESOLUTION ENHANCEMENT

STATEMENT OF FEDERALLY-SPONSORED RESEARCH

This invention was made with government support under W911NF-08-2-0004 awarded by the Army/ARO. The government has certain rights in the invention.

TECHNICAL FIELD

This invention relates to all digital phase locked loops (ADPLLs).

BACKGROUND

All digital phase-locked loops (ADPLLs) are preferred for frequency generation over traditional analog phase-locked loops (PLLs) to take advantage of process scaling. ADPLL architectures offer area savings by eliminating large loop filters, reconfigurability of the loop gain and bandwidth, and are mostly portable across processes. However, ADPLL performance inherently suffers due to time-to-digital conversion (TDC) and digital controlled oscillator (DCO) quantization errors which contribute to the in-band and out-of-band phase noise. Moreover, most ADPLLs use digital-to-analog converters (DACs) and delta-sigma ($\Delta\Sigma$) modulators (or DSMs) to improve the DCO resolution, which require carefully matched custom design.

SUMMARY

According to one aspect there is provided a method of controlling a phase-locked loop (PLL) output ($f_{DCO}$) using an all digital phase-locked loop (ADPLL) that includes the steps of: receiving a reference signal ($f_{REF}$) at a controller and a time-to-digital converter (TDC), the controller and TDC being coupled to multiple tunable delay elements; receiving at the multiple tunable delay elements a first signal input via the controller and a pulse-width modulation (PWM) circuit; providing an PLL output ($f_{DCO}$) to the TDC at least partially based on the first signal input; and generating a phase error output ($\Phi_{ERR}$) based on the reference signal ($f_{REF}$) and the PLL output ($f_{DCO}$), wherein the phase error output ($\Phi_{ERR}$) is provided as feedback to the controller to control the PLL output ($f_{DCO}$).

According to another aspect there is provided a method of developing a System-on-a-Chip (SoC) that includes the steps of: receiving from a user instructions in a hardware description language (HDL) at a silicon compiler, wherein the instructions define an all digital phase-locked loop (ADPLL); compiling the instructions; and constructing the SoC having the ADPLL defined by the instructions, wherein the ADPLL includes: a plurality of tunable delay elements; a controller; and a pulse-width modulation (PWM) circuit. The controller may be configured to: provide a first resolution adjustment signal to the PWM circuit, which PWM circuit may be configured to provide a first input signal to the plurality of delay elements based on the first resolution adjustment signal and the current output of the plurality of tunable delay elements; receive a phase error output ($\Phi_{ERR}$) that is based on a reference signal ($f_{REF}$) and the current output of the plurality of tunable delay elements; and alter the first resolution adjustment signal based on the phase error output ($\Phi_{ERR}$).

BRIEF DESCRIPTION OF THE DRAWINGS

Preferred exemplary embodiments will hereinafter be described in conjunction with the appended drawings, wherein like designations denote like elements, and wherein.

DETAILED DESCRIPTION

Digital synthesis and automatic place-and-route (APR) flows can be utilized for all digital phase-locked loop (ADPLL) devices to simplify the design phase and facilitate easier integration with systems-on-a-chip (SoC). Some traditionally mixed-signal systems such as analog-to-digital converters (ADCs) and ADPLLs are already being implemented with digital synthesis tools. According to one embodiment, a sub-sampling, integer-N ADPLL may be used. One aspect of the present ADPLL is that it may be completely designed and automatically placed-and-routed using digital design flows. Another aspect of the present ADPLL is that the resolution of a digitally-controlled oscillator (DCO) may be enhanced using a pulse-width-modulation (PWM) technique to control the signals from the DCO. Traditionally, this has been done using digital-to-analog converter(s) (DAC) and delta-sigma modulators (DSMs). Using the PWM technique described herein has the advantage of eliminating or reducing the number of spurs (or spurious signals), and allows DCO tuning with 59 kHz steps. An adaptive digital loop filter (DLF) may be implemented to allow a large lock-in range as well as have low bandwidth to suppress time-to-digital converter (TDC) noise. In at least one implementation, the ADPLL's Figure of Merit (FoM) may be −218 dB at 403 MHz, and may cover an entire MedRadio range (e.g., 401-457 MHz). It will be appreciated the MedRadio range discussed herein is merely one implementation used to illustrate the operation of the system and methods described; the ADPLL may cover other suitable ranges and applications as well.

Overall Architecture

Figure 1:
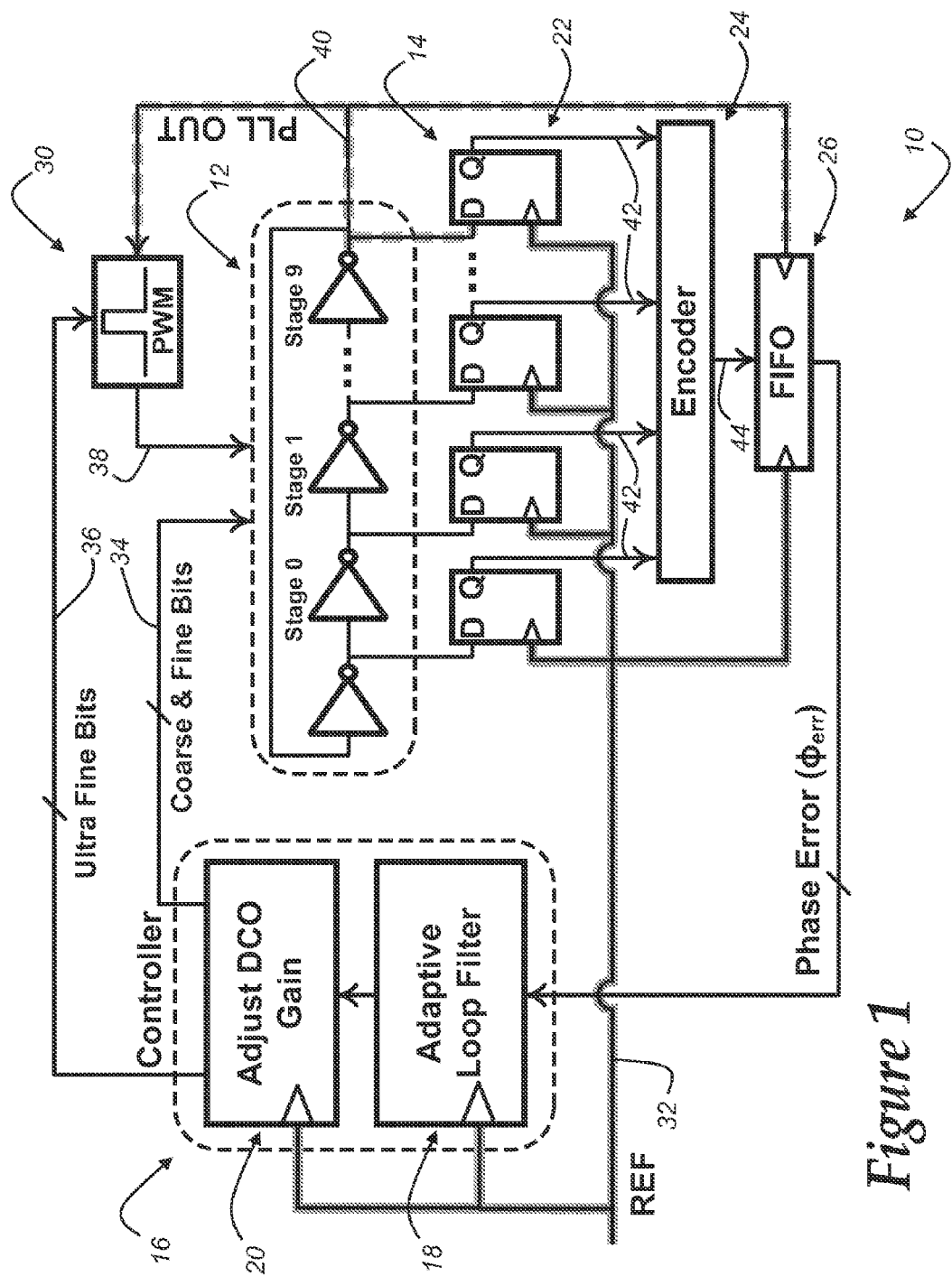
FIG. 1 is a schematic diagram illustrating an all digital phase-locked loop (ADPLL) architecture.

FIG. 1 shows a schematic view or diagram of an ADPLL system or architecture 10 suitable for using a PWM-based resolution enhancement technique. The architecture includes a plurality of tunable delay elements 12 (illustrated as a 10-stage ring digitally-controller oscillator (DCO)), an embedded TDC 14, and a controller 16 (illustrated as a DCO controller or DCO controller state machine) that includes an adaptive DLF 18 coupled to a gain adjust 20. The adaptive DLF observes a TDC output ($\Phi_{ERR}$) over a programmable measurement window, and then a decision by the DCO controller is made whether to increment or decrement the frequency. In one implementation, a default setting for the measurement window may be 100 reference cycles (or any other suitable quantity), but can be programmed through a scan chain (see FIG. 8). The DCO controller 16 may send a 20-bit coarse, 20-bit fine, and a 7-bit ultra-fine frequency control word to the DCO 12. The coarse and fine control bits may be thermometer encoded, and the ultrafine frequency bits may be binary encoded.

In FIG. 1, the 10-stage ring DCO is merely one example. The illustration shows ten delay elements daisy chained to one another—the output of one being the input of the next, and the output of the last delay elements coupled to the input of the first. DCOs of this configuration, as well as their implementation, are known to skilled artisans. In addition, other configurations of the DCO are also possible. For example, while ten stages are shown (Stage0 to Stage9), fewer or greater quantities of stages are possible.

The TDC may be embedded and may comprise a series of D flip-flops 22 correspondingly coupled to the stages of the DCO 12. Similarly, while ten D flip-flops are shown, in other configurations, fewer or greater quantities are possible. The TDC further comprises an encoder 24 and a FIFO (first-in, first-out) device 26.

FIG. 1 also illustrates a PWM circuit 30 that is in communication with the DCO 12. As will be described in greater detail below, PWM modulation may be used to fine-tune the DCO 12 to provide a more defined phase-locked loop (PLL) output ($f_{DCO}$).

The architecture 10 of FIG. 1 may be electrically coupled according the implementation shown. For example, a system reference signal ($f_{REF}$) may be received via a coupling 32. This coupling 32 may be connected to the gain adjust 20, the DLF 18, the series of D flip-flops 22, and the FIFO device 26. Couplings 34, 36 may connect the DCO controller 16 to the DCO 12 and the PWM circuit 30, respectively. The PWM circuit 30 may have an output coupling 38 to the DCO 12 as well. The DCO 12 may have an output coupling 40 to both the PWM circuit 30 and the TDC 14 (more specifically, to one of the D flip-flops in the series 22 and the FIFO device 26). The series of D flip-flops 22 may each have an output coupling 42 to the encoder 24, which in turn may have a coupling 44 to the FIFO device 26. And the FIFO device 26 may have an output coupling 46 to the controller 16 (e.g., more specifically, to the DLF 18).

It should be appreciated that in other embodiments the multiple tunable delay elements may include a delay-locked loop (DLL) configuration instead. In addition, the PWM circuit 30 could be coupled to other devices (e.g., to receive multiple outputs from the controller 16 or be uncoupled from the DCO 12).

The entire ADPLL architecture 10 may be cell-based, and the layout automatically placed-and-routed using digital design flows (implementation techniques of digital design flows are known). This may include the DCO and the TDC—which may introduce a systematic mismatch in wiring capacitance. For example, this may include a stage-to-stage mismatch that causes a bounded differential non-linearity in the TDC. The TDC output may be processed in the adaptive DLF in order to mitigate the effect of mismatches, as discussed in more detail below.

Circuit Design

A. Phase Detection Scheme: Embedded TDC

A phase detection scheme or method is based on use of the embedded TDC 14. The embedded TDC samples all ten phases of the DCO (every rising edge of the reference), and encodes the error signal into a 5-bit output ($\Phi_{ERR}$). If there is a difference between $f_{REF}$ and $f_{DCO}$ ($\Delta f$), the internal edges of the DCO will slide with respect to the reference edge, and the $\Phi_{ERR}$ observed by the TDC will be a cyclic phase measurement. The slope of $\Phi_{ERR}$ represents the magnitude and sign of $\Delta f$. When $\Delta f$ is small, the TDC resolution may be further enhanced by counting (e.g., using an 8-bit phase counter in the DCO controller) the number of $f_{REF}$ cycles for which $\Phi_{ERR}$ stays within one state, and a resultant TDC least significant bit (LSB) becomes $T_{DCO}/2^{13}$ (e.g., approximately 300 femtoseconds (fs) at 403 MHz). The 5-bit output (from the embedded TDC 14) combined with the 8-bit phase counter effectively may provide 13-bit phase resolution. Typically, ADPLLs require the TDC step to be normalized to $T_{DCO}$. This is because the TDC step is independent of the DCO frequency, and the loop gain varies as a function of DCO frequency—an undesirable non-linearity. However, in the embedded TDC 14 architecture, the TDC step size depends on the delay per stage of the DCO and therefore, the step size tracks the DCO period and thus, according to one embodiment, eliminates the need for TDC step normalization.

B. Digitally-Controlled Oscillator (DCO)

Figure 2:
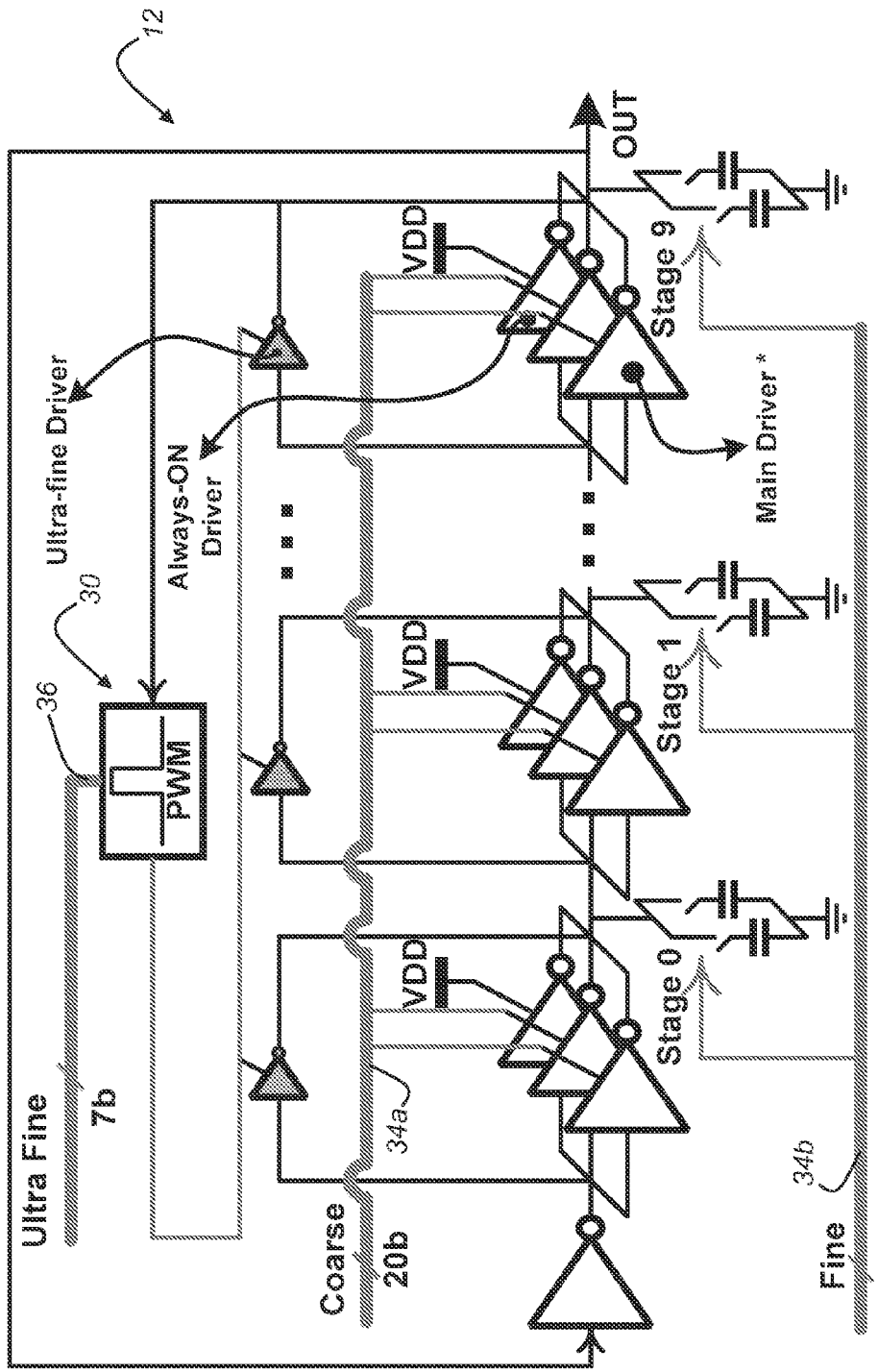
FIG. 2 illustrates in greater detail a portion of the schematic diagram of FIG. 1.
Figure 3:
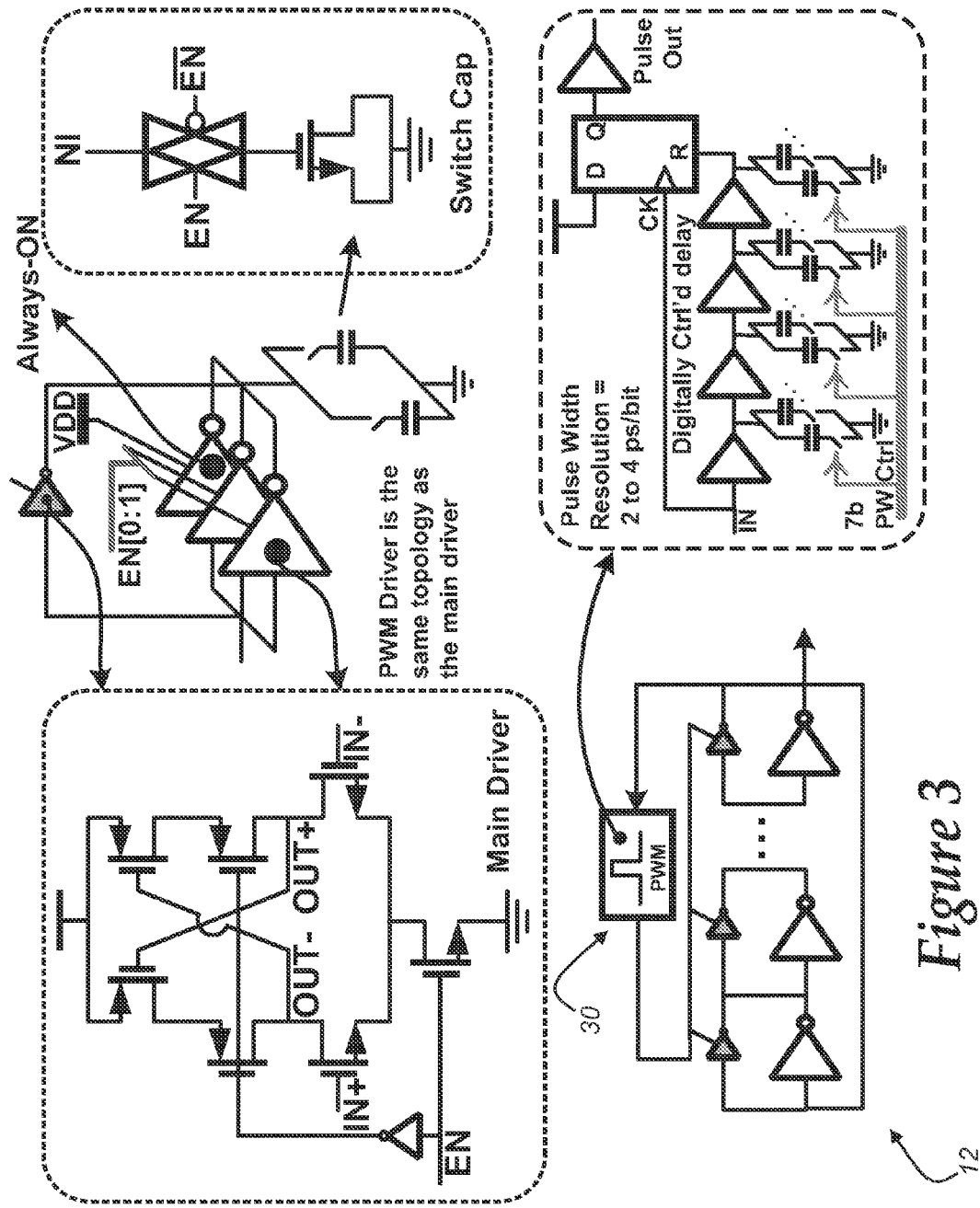
FIG. 3 illustrates in greater detail multiple digital-controlled oscillator (DCO) cells that are shown in FIG. 2.

FIG. 2 illustrates the architecture of the DCO 12 coupled to the PWM circuit 30 driving the control of all ultra-fine drivers together. The detailed schematic of the cells used in the DCO 12 and the PWM circuit 30 are shown in FIG. 3. A unit main driver cell may be a differential pair with cross-coupled PMOS loads which can be turned on/off by the enable (EN) signal. A unit switch-capacitor cell may be a transmission gate loaded with an NMOS device. A unit ultra-fine driver cell may be a 40 times weaker version of the main driver cell. In one implementation, these three cells may be the only custom cells in the ADPLL 10, and may have the same pitch as the standard cells. A 7-bit PWM signal may be generated using the same driver and switch-capacitor cells as in the DCO. The DCO features may include three different step sizes: coarse, fine, and ultra-fine (e.g., different resolution adjustments, e.g., via couplings 34a, 34b, 38). It may be tuned with 9 MHz/bit coarse steps and 1.2 MHz/bit fine steps (e.g., bit data). The coarse steps may be set by turning parallel main drivers on/off while the fine tuning may be accomplished by enabling parallel switch-capacitor cells. The enable of each coarse and/or fine cell may be independently indexed by the controller.

C. Adaptive Digital Loop Filter

Figure 4:
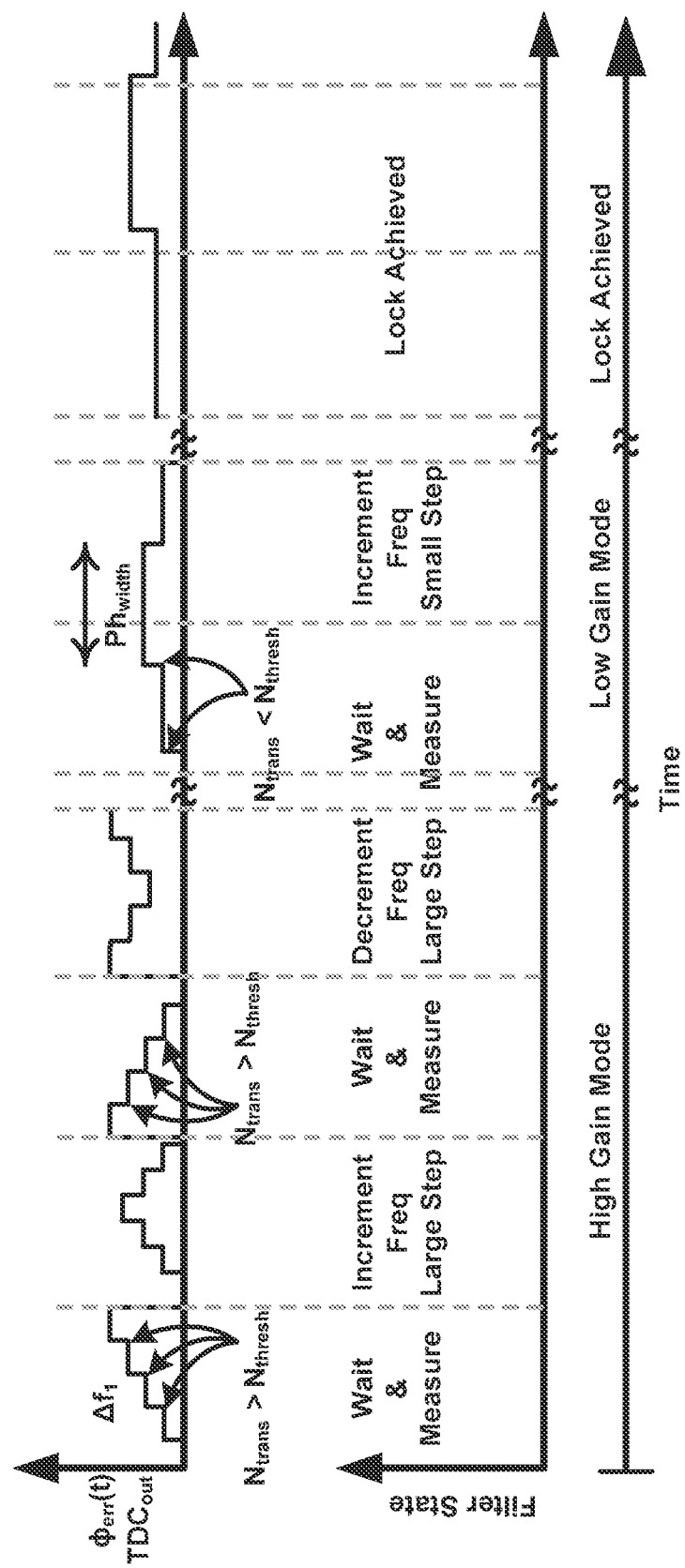
FIG. 4 illustrates multiple adaptive filter states as a function of time.

The adaptive DLF 18 may have low and high gain modes. For $\Delta f$ (difference between $f_{REF}$ and $f_{DCO}$) larger than a threshold value, the loop may operate in the high gain mode and $\Delta f$ may be measured and used to adjust the loop gain. The loop may switch to low gain mode when $\Delta f$ reaches the threshold value, after which the gain may be adjusted based on the phase measurement. The operation of the adaptive DLF 18 and DCO controller 16 is illustrated by a timing diagram in FIG. 4. The DLF 18 observes $\Phi_{ERR}$ over the measurement window and determines the gain mode automatically based on $\Delta f$. When $\Delta f$ is larger than the threshold value, larger bandwidth is desired to settle fast. The DLF 18 measures the number of transitions ($N_{trans}$) in $\Phi_{ERR}$, essentially differentiating $\Phi_{ERR}$ to obtain $\Delta f$. $N_{trans}$ represents the magnitude, and an up/down direction of the transition represents the sign of $\Delta f$. Based on $N_{trans}$, the DLF performs a linear search for the appropriate DCO step size. A programmable $N_{thresh}$ defines the boundary between low gain and high gain modes. In one implementation, a small $\Delta f$ may be defined by the number of $\Phi_{ERR}$ transitions in one measurement window being less than 10. In this case, higher resolution may be desired and the DLF 18 may automatically switch to low gain mode. In low gain mode, the phase error is measured by counting the number of reference cycles between two transitions of $\Phi_{ERR}$ to determine the phase width ($Ph_{width}$). This represents how long it takes for the DCO edge to slide from one phase to the next; therefore, it represents $\Delta f$. Once the $Ph_{width}$ is determined, a linear search may choose one of four small DCO step sizes. The entirety of the DLF 18 may be implemented on an integrated circuit chip. The adaptive DLF may permit a lock-in range of ±30 MHz. When the PLL output is locked to the reference, the $\Phi_{ERR}$ behaves like a bang-bang phase detector and frequency is controlled with an ultra-fine LSB (59 kHz) around the desired frequency.

In the high gain mode, the effect of stage-to-stage mismatch is alleviated by measuring the slope of $\Phi_{ERR}$ ($N_{trans}$) over multiple reference cycles. In this manner, any differential non-linearity in the DCO due to stage-to-stage mismatch is averaged because the total delay (sum of individual delays) always equals $T_{DCO}$.

DCO Resolution Enhancement

Figure 5:
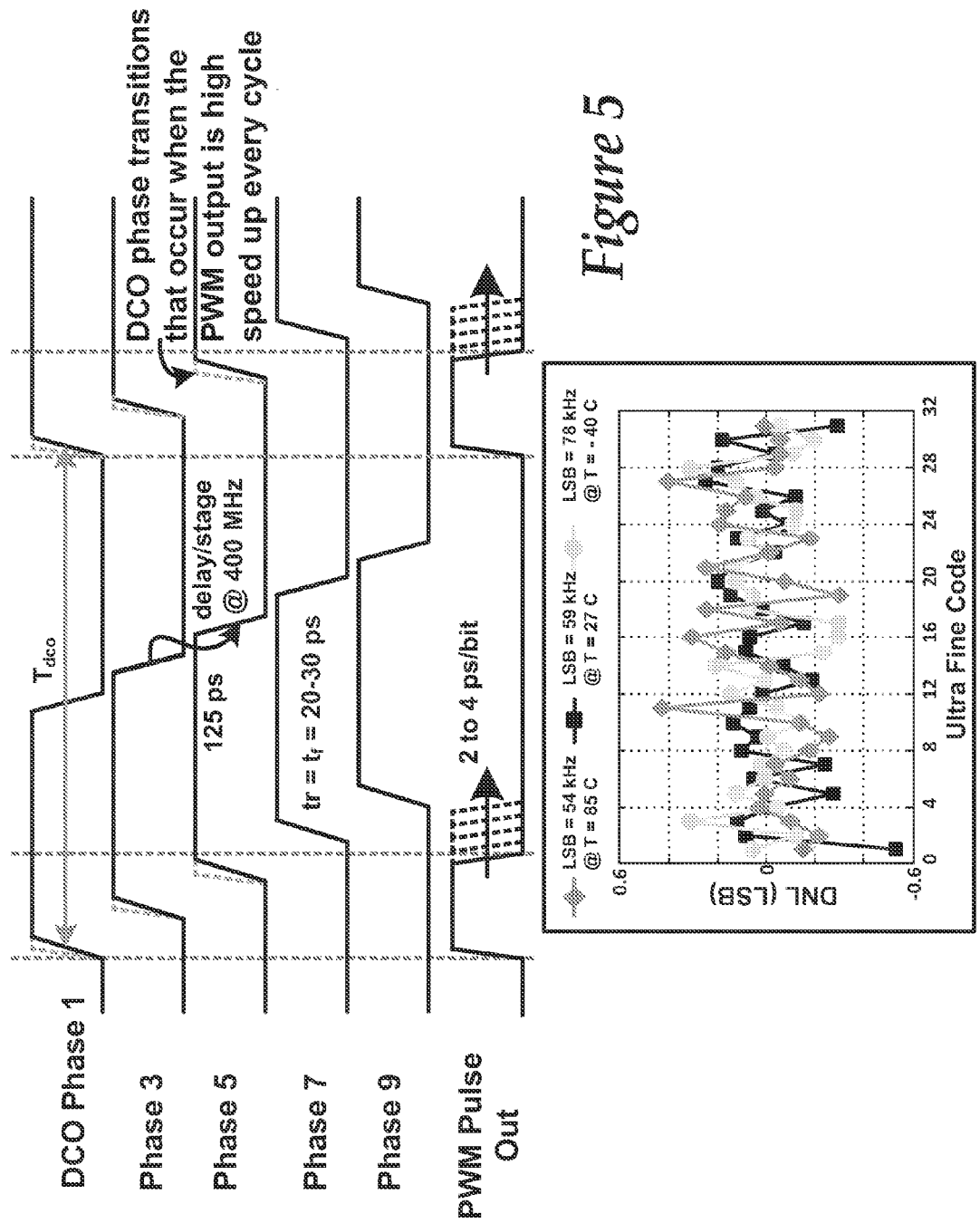
FIG. 5 is a diagram illustrating a principle of operation of resolution enhancement technique using pulse-width modulation (PWM) and a measured differential non-linearity (DNL) of ultra-fine frequency tuning using the PWM-based technique.

FIG. 5 shows an illustrative principle of operation of the PWM technique. Referring to FIG. 2, the ultra-fine driver (which may be 40 times weaker than the main drivers) is connected in parallel to each stage of the DCO. The DCO resolution may be enhanced by: the PWM generating synchronous pulses from the DCO output at the DCO frequency, which concurrently enable all 10 ultra-fine drivers for a portion or fraction of $T_{DCO}$. As an edge propagates through the DCO, only the transitions, or fractions of transitions that overlap the PWM pulse in time will be sped up by the ultra-fine driver. All other transitions will be unaffected (illustrated in FIG. 5). The frequency may increase as a function of the pulse width. Because the PWM signal may be applied each DCO period, the pulse may modify the DCO's internal edges the same way each cycle—thus, altering or changing its frequency by a relatively small amount. Thus, using PWM control, the frequency of the DCO 12 may be fine-tuned without producing spurs, unlike traditional LSB dithering which toggles between larger frequency steps and introduces spurs which are then rejected using a DSM. Thus, this PWM technique may replace conventional means that include use of a DAC and/or DSM. FIG. 5 illustrates the measured DNL of ultra-fine (PWM) tuning as a function of temperature. The least desirable instance of DNL at 403 MHz is -0.55 LSB. Finally, this coarse/fine tuning combined with PWM control decouples the resolution versus tuning range tradeoff, and the DCO 12 is able to have small quantization error as well as a wide tuning range.

Design Methodology

Figure 6:
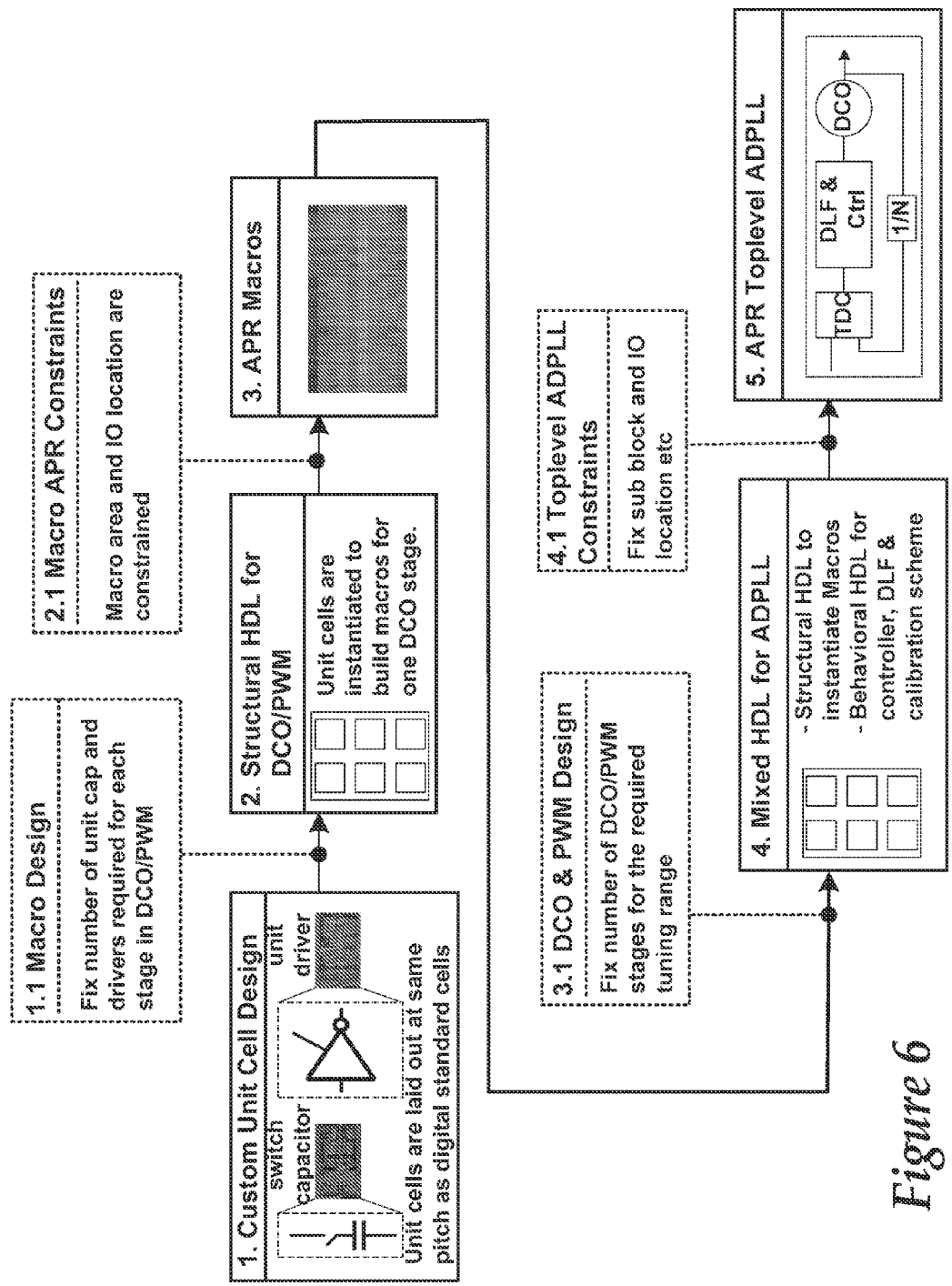
FIG. 6 is a diagram of a design flow methodology for the ADPLL.

A flow diagram of one illustrative method is shown in FIG. 6; the method utilizes automated digital flows to accelerate the duration of the design phase. The method begins by identifying one or more core, tri-state unit cells that will be arrayed to form a digitally tunable delay element(s). This step may include designing and performing a layout of these unit cells with a standard or conventional cell pitch. The unit cells may be approximately the size of a D flip-flop standard cell. These cells are then integrated with the synthesis and APR flows, after which an HDL description of the entire ADPLL may be used to synthesize and automatically place-and-route the ADPLL. Tools (e.g., computer-aided drafting or CAD tools) may also be used to create macros for sub-blocks to achieve a moderate amount of matching in the layout. For example, in the ADPLL architecture 10, a macro for one stage of the DCO was first automatically placed-and-routed that included three main drivers and two switch capacitor cells. This macro was then instantiated in HDL ten times to create a ten-stage DCO. This methodology significantly accelerates the design phase because most of the design decisions are made at the architectural level, therefore design iterations are completely automated. Moreover, the number and complexity of required design rule checks grows exponentially with scaling, but according to the described method, the tools handle this volume and complexity.

Thus according to at least one method of the present disclosure, a PLL output ($f_{DCO}$) may be controlled. The method may include receiving a reference signal ($f_{REF}$) via coupling 32 at the controller 16 and the TDC 14. A first signal input may be received by the DCO 12 from the PWM circuit 30 via coupling 38. This first signal input may correspond to ultra-fine bit data (or an ultra-fine resolution adjustment signal) sent from the controller 16 to the PWM circuit 30 as a result of a phase error output ($\Phi_{ERR}$) received by the controller 16 via coupling 46—the PWM circuit generating the first signal input as described above. After receiving the first signal input, the DCO 12 may provide a PLL output ($f_{DCO}$). The PLL output ($f_{DCO}$) may be comprised of a fundamental frequency (as typical of conventional oscillators—or a multiple or harmonic thereof) as well as an adjustment based (at least partially) on the first signal input. The PLL output ($f_{DCO}$) may be provided to at least one of the D flip-flops in the series 22, the PWM circuit 30 (for synchronicity as discussed above), and the FIFO device 26. As a result of the TDC 14 receiving the PLL output ($f_{DCO}$) (e.g., via series 22 and FIFO 26) and as a result of receiving the reference signal ($f_{REF}$) via coupling 32, the TDC may generate a phase error output ($\Phi_{ERR}$) and send it to the controller 16 via coupling 46 as feedback—more specifically, to the DLF 18.

The method described above may also include additional steps. For example, the DCO 12 may receive a second signal input from the controller 16. The second signal input may correspond to coarse and fine bit data (or coarse and/or fine resolution adjustment signals) sent from the controller 16 to the DCO 12. Regardless, this bit data may be used to alter (or phase shift) the PLL output ($f_{DCO}$) as well when combined with the frequency generated by the DCO 12.

Another method of the present disclosure includes a method of developing a SoC. The method may include receiving instructions from a user (e.g., via a computer interface such as a testbench or silicon compiler). The instructions may be in hardware description language (HDL) and may define the ADPLL. The instructions may be iteratively tested and simulated via the testbench. Once the format of the instructions is desirable, the instructions may be compiled using the compiler. After compilation, the SoC may be constructed having the ADPLL defined thereby. And the instructions may define an ADPLL such as the one shown in figures herein.

Measurement Results

The previously described architecture 10 has been tested, and empirical data is provided below that demonstrates a performance improvement. The ADPLL may perform integer-N synthesis without a divider by sub-sampling the TDC output for division ratios greater than one. The division ratio (N) can be programmed by a frequency control word in the controller. The in-band phase noise is −98 dBc/Hz for $f_{REF}$=403 MHz (N=1 and BW=140 kHz) and −87 dBc/Hz for 40.3 MHz (N=10 and BW=40 kHz).

Figure 7:
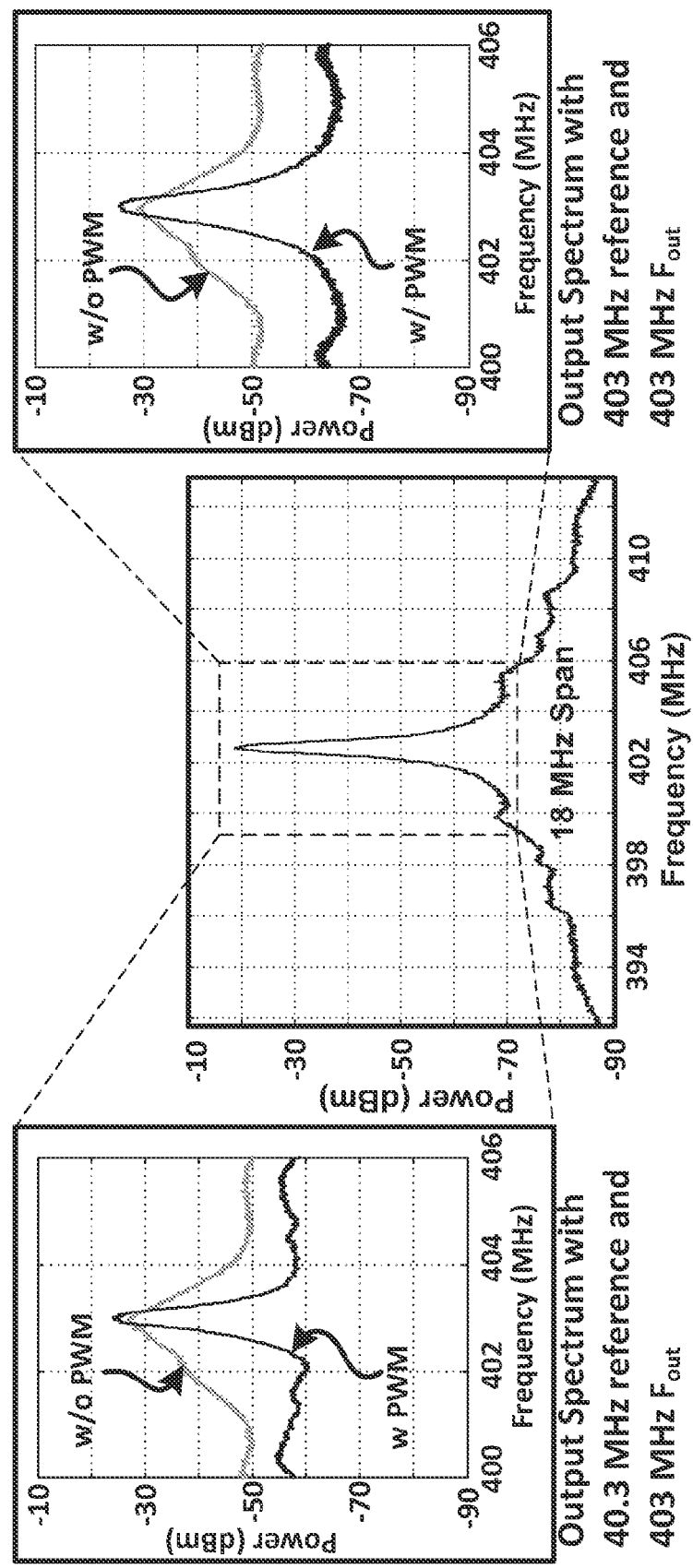
FIG. 7 illustrates: an ADPLL output spectrum with and without the PWM-based resolution enhancement technique at 403 MHz, and an output spectrum at 403 MHz with a 40.3 MHz reference.

FIG. 7 shows the output spectrum for $f_{out}$=403 MHz for 403 MHz and 40.3 MHz reference frequencies. The PLL output ($f_{DCO}$) in lock state with and without PWM-based resolution enhancement is shown. This results in 14 dB and 11 dB improvements in in-band phase noise for 403 MHz and 40.3 MHz reference frequencies, respectively, with a measured rms period jitter of 7.9 picoseconds (ps) and 13.3 ps. The ADPLL may be implemented in a 65 nm CMOS process, and may occupy an active area of approximately 0.1 mm$^2$. The ADPLL may cover the MedRadio bands and may consume 2.1 mA and 3.3 mA from a 1.0V supply, for N values of 10 and 1, respectively. The PWM block consumes 770 µW and occupies 93×110 µm. Of course, as discussed above, the MedRadio implementation is merely one of many implementations.

Figure 8:
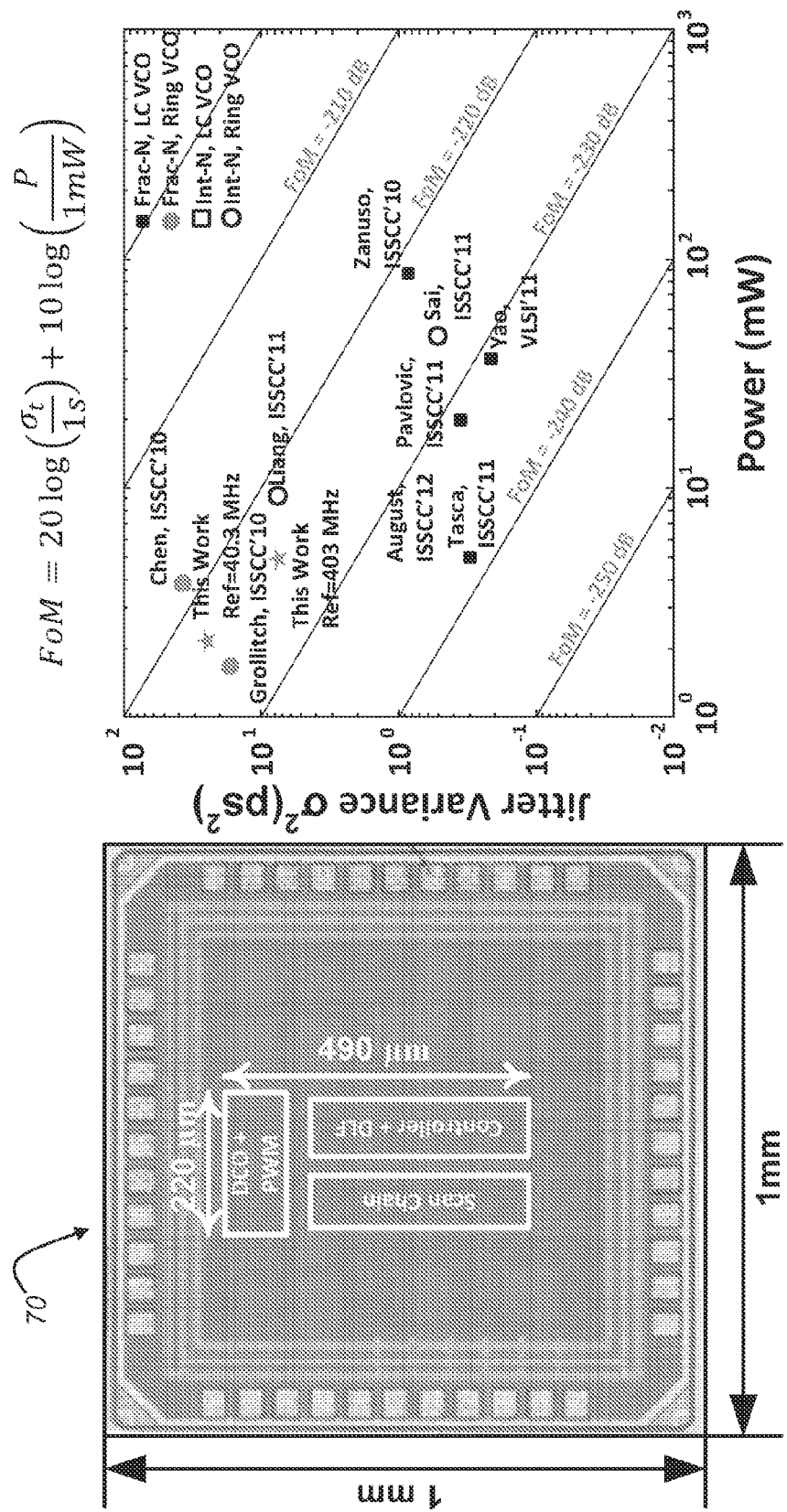
FIG. 8 illustrates an ADPLL die photo and Figure of Merit (FoM) comparison.

FIG. 8 (photo) illustrates an illustrative ADPLL die 70 and several blocks exemplifying spatial relationships and dimensions of the DCO, PWM, controller, and scan chain.

FIG. 8 also shows the overall FoM of this PLL compared with state-of-the-art ADPLLs. For example, the figures shows several other works or references (e.g., citing the work (e.g., ISSCC or International Solid State Circuits Conference) and author (e.g., Chen, Sai, etc.), all references are typically known or available to skilled artisans).

Table I compares more specific performance metrics of the present disclosure to some recently published state-of-the-art ADPLLs (where "A" represents ISSCC Digest of Technical Papers (2010), "B" represents JSSC (2011), and "C" represents ISSCC Digest of Technical Papers (2012)).

TABLE I

ADPLL Performance Comparison

| | Present Disclosure | | A | B | C |
|---|---|---|---|---|---|
| $F_{REF}$ (MHz) | 403 | 40.3 | 26 | 544 | 108/72/36 |
| $F_{OUT}$ (MHz) | 403 | 403 | 800 | 0.7-3.5 | 3100 |
| RMS Jitter | 7.9 ps | 13.3 ps | 21.5 ps | 1.6 ps | 1.01 ps |
| PN (dBc/Hz) | −98 @ 1 MHz | −87 @ 1 MHz | −98 @ 1 MHz | −116 @ 1 MHz | — |
| Area | 0.1 mm$^2$ | 0.1 mm$^2$ | 0.05 mm$^2$ | 0.36 mm$^2$ | 0.32 mm$^2$ |
| Power | 3.3 mA | 2.1 mA | 2.66 mA | 1.6 mA | 27.5/26.8/25.8 mA |
| VDD | 1 | 1 | 1.1-1.3 | 1 | 1.2 |
| Architecture | ADPLL | ADPLL | ADPLL | Highly Digital | ADPLL |
| DAC & ΔΣ | No | No | DAC & ΔΣ | Multiple DACs | DAC |
| Technology | 65 nm | 65 nm | 65 nm | 90 nm | 65 nm |

CONCLUSION

The present disclosure provides a sub-sampling integer-N ADPLL that was completely designed using digital design flows. This methodology significantly simplifies the design phase for ADPLLs and permits process scaling. A PWM-based DCO resolution enhancement technique has been introduced which improves the DCO resolution to 59 kHz/LSB. This resolution enhancement is implemented at the DCO frequency, unlike traditional dithering, and therefore may not introduce any spurs. The FoM of this automatically placed-and-routed ADPLL is −214 dB, which is comparable to conventional ADPLLs that have not implemented digital design flows.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of controlling a phase-locked loop (PLL) output using an all digital phase-locked loop (ADPLL), comprising the steps of:
   receiving a reference signal at a controller and a time-to-digital converter (TDC), the controller and TDC being coupled to a plurality of tunable delay elements;
   receiving at the plurality of tunable delay elements a first signal input via the controller and a pulse-width modulation (PWM) circuit;
   providing an PLL output to the TDC at least partially based on the first signal input; and
   generating a phase error output based on the reference signal and the PLL output, wherein the phase error output is provided as feedback to the controller to control the PLL output.

2. The method of claim 1, wherein the plurality of tunable delay elements provide a fundamental frequency, wherein the PLL output further is based partially on the fundamental frequency or a harmonic thereof.

3. The method of claim 1, wherein the plurality of tunable delay elements is a digitally-controlled oscillator (DCO), wherein the controller is a DCO controller.

4. The method of claim 3, wherein the plurality of tunable delay elements is a multi-stage ring DCO.

5. The method of claim 1, further comprising receiving at the plurality of tunable delay elements a second signal input via the controller.

6. The method of claim 5, wherein the second signal input includes one of a coarse resolution adjustment or a fine resolution adjustment, wherein the first signal input includes an ultra-fine resolution adjustment from the controller.

7. The method of claim 6, further comprising sending ultra-fine bit data from the controller to the PWM circuit and sending coarse bit data, fine bit data, or both from the controller to the plurality of tunable delay elements.

8. The method of claim 1, wherein at least the first signal input is synchronous with the PLL output.

9. A method of developing a System-on-a-Chip (SoC), comprising the steps of:
receiving from a user instructions in a hardware description language (HDL) at a silicon compiler, wherein the instructions define an all digital phase-locked loop (ADPLL);
compiling the instructions; and
constructing the SoC having the ADPLL defined by the instructions, wherein the ADPLL comprises:
a plurality of tunable delay elements;
a controller; and
a pulse-width modulation (PWM) circuit,
wherein the controller is configured to:
provide a first resolution adjustment signal to the PWM circuit, which PWM circuit is configured to provide a first input signal to the plurality of delay elements based on the first resolution adjustment signal and the current output of the plurality of tunable delay elements;
receive a phase error output that is based on a reference signal and the current output of the plurality of tunable delay elements; and
alter the first resolution adjustment signal based on the phase error output.

10. The method of claim 9, wherein the plurality of tunable delay elements is one of a digitally-controlled oscillator (DCO) or a delay-locked loop (DLL) circuit.

11. The method of claim 9, wherein the controller is further configured to provide a second resolution adjustment signal to the plurality of delay elements that affects the current output of the plurality of tunable delay elements.

12. The method of claim 11, wherein the controller is further configured to receive the first resolution adjustment signal and the second resolution adjustment signal severally or simultaneously.

13. The method of claim 9, further comprising storing the instructions in a digital cell library.

14. The method of claim 9, wherein the provided SoC further comprises both digital and analog cells.

* * * * *